（12）United States Patent
Jiang et al.

(10) Patent No.: US 7,209,848 B2
(45) Date of Patent: Apr. 24, 2007

(54) PULSE STRETCHING ARCHITECTURE FOR PHASE ALIGNMENT FOR HIGH SPEED DATA ACQUISITION

(75) Inventors: Xicheng Jiang, Irvine, CA (US); Chun-Ying Chen, Irvine, CA (US); Kevin Miller, Lawrenceville, GA (US); Joel Danzig, Alpharetta, GA (US); Beth Wilcher, Atlanta, GA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/256,156

(22) Filed: Oct. 24, 2005

(65) Prior Publication Data

US 2006/0161370 A1 Jul. 20, 2006

Related U.S. Application Data

(60) Provisional application No. 60/621,471, filed on Oct. 25, 2004.

(51) Int. Cl.
*G01R 35/00* (2006.01)
(52) U.S. Cl. ....................... 702/107; 702/106
(58) Field of Classification Search ......... 702/106–107
See application file for complete search history.

(56) References Cited

U.S. PATENT DOCUMENTS 4,642,629 A * 2/1987 Milligan ..................... 340/825
5,742,799 A * 4/1998 Alexander et al. .......... 713/401

* cited by examiner

*Primary Examiner*—John Barlow
*Assistant Examiner*—Jonathan Moffat
(74) *Attorney, Agent, or Firm*—Sterne, Kessler, Goldstein & Fox P.L.L.C.

(57) ABSTRACT

Systems and methods for pulse stretching architectures for phase alignment of multi-frequency clocks for high speed data acquisitions are disclosed. A high speed data acquisition system includes a transmitter and a receiver. The receiver includes a multi-frequency clock generator that generates a plurality of clock signals, a pattern check module that detects a test pattern received from the transmitter and outputs a stretch command signal, and a stretch pulse generator that receives the stretch command signal and provides a stretch pulse signal that aligns the phases of the plurality of clock signals generated by the multi-frequency clock generator. Methods for initializing and shifting multi-phase clock signals to optimize error performance of a high speed data acquisition system are also provided.

17 Claims, 7 Drawing Sheets

FIG. 7

PULSE STRETCHING ARCHITECTURE FOR PHASE ALIGNMENT FOR HIGH SPEED DATA ACQUISITION

CROSS REFERENCE TO RELATED APPLICATIONS

This application claims the benefit of priority to U.S. Provisional Patent Application, Application No. 60/621,471, filed Oct. 25, 2004, which is incorporated herein by reference in its entirety.

BACKGROUND OF THE INVENTION

1. Field of the Invention

The invention relates to high speed data processing systems, and more particularly to pulse stretching architectures for phase alignment for high speed data acquisition.

2. Background Art

High speed data processing systems, such as high speed data acquisition systems frequently require adjustments to the phases of clocks used to sample incoming data. A failure to properly adjust the phases of clocks can lead to high bit error rates and degrade system performance. For example, if low speed data is serialized in later stages of a data acquisition system, then all higher speed clock phases used in the later stages that require a fixed timing relationship with the first sample clock, are required to be adjusted accordingly.

Existing systems and methods to ensure the proper phase of sampling clocks are often complicated and use excessive power. For example, one approach uses multiplexers and counters to choose the right phase to be used for each of the sampling clock signals. This approach requires many extra circuits and power consumption is relatively high. In another approach a phase rotator and digital logic are used to select the clock phase of the sampling clocks. Using this approach, the resulting circuitry is often very complicated and therefore costly to implement.

What are needed are pulse stretching architectures for phase alignment of multi-frequency clocks for high speed data acquisition.

BRIEF SUMMARY OF THE INVENTION

Systems and methods for pulse stretching architectures for phase alignment of multi-frequency clocks for high speed data acquisitions are disclosed. In an embodiment, a high speed data acquisition system includes a transmitter and a receiver. The receiver includes a multi-frequency clock generator that generates a plurality of clock signals, a pattern check module that detects a test pattern received from the transmitter and outputs a stretch command signal, and a stretch pulse generator that receives the stretch command signal and provides a stretch pulse signal that aligns the phases of the plurality of clock signals generated by the multi-frequency clock generator. Methods for initializing and shifting multi-phase clock signals to optimize error performance of a high speed data acquisition system are also provided.

Further embodiments, features, and advantages of the invention, as well as the structure and operation of the various embodiments of the invention are described in detail below with reference to accompanying drawings.

BRIEF DESCRIPTION OF THE FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the invention would be of utility.

The timing or the phase relationship between the incoming data from a transmitter and the receiving clock in a receiver is very important within data communications. A phase misalignment between the clock and the data will increase the system bit error rate. However, it is difficult to control the right clocking phase to the incoming data in high speed data communications because not only are the clock periods relatively short, but also various factors affect the propagation delay in a data path, which results in a small timing margin or error. For example, if a transmitter and a receiver are in two different chips, the printed circuit board (PCB) and the buffer stages in each chip contribute propagation delays that are a function of process, temperature and voltage.

Figure 1:
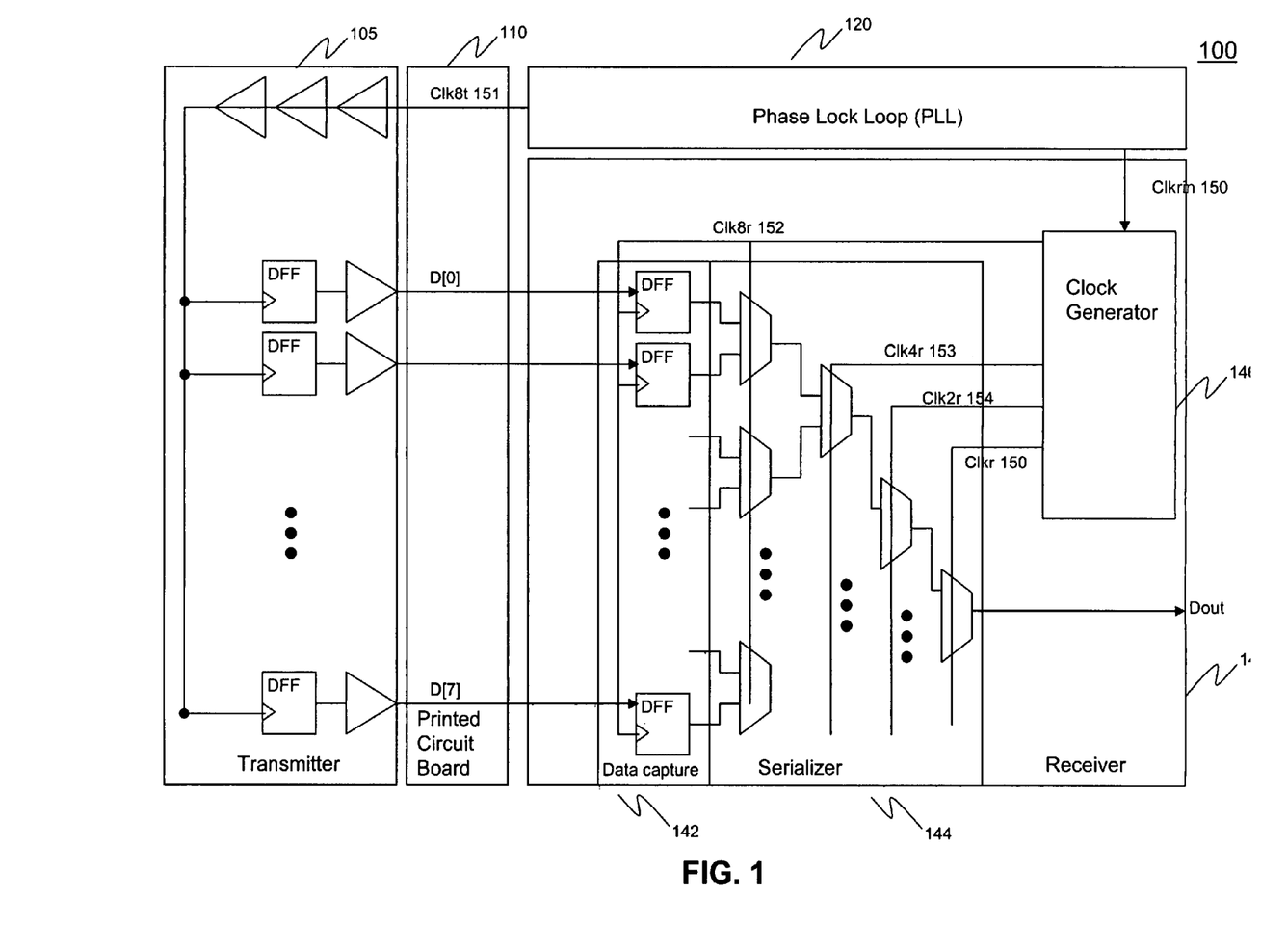
FIG. 1 is a diagram of a high speed data acquisition system.

FIG. 1 provides a diagram of a high speed data acquisition system 100. High speed data acquisition system 100 includes a transmitter 105 and a receiver 140. Transmitter 105 transmits parallel digital data to receiver 140. In an embodiment, printed circuit board 110 couples transmitter 105 to receiver 140. Receiver 140 processes the received data and outputs the received parallel data as a serial data stream.

Receiver 140 includes data capture module 142, serializer 144 and clock generator 146. Data capture module 142 provides for the initial capture of parallel data received from transmitter 105. Serializer 144 multiplexes the digital parallel input data received from transmitter 105 to a single high speed data path. Clock generator 146 generates a variety of output clocks that are used to synchronize data capture module 142 and serializer 144.

High speed clock signals, clkrin 150 and clk8t 151 are generated by Phase lock loop (PLL) circuit 120. PLL circuit 120 transmits clkrin 150 to clock generator 146. Based on clkrin 150, clock generator 146 generates the necessary lower-speed clocks for use in serializer 144. In particular, clock generator 146 generates clk8r 152, clk4r 153, and clk2r 154. The clkr8r 152 signal is provided to the clock inputs of flip-flops in data capture module 142. The clk8r 152, clk4r 153, clk2r 154 and clkr 150 signals are provided to gates within the various stages in serializer 144.

PLL circuit 120 provides a clock signal, clk8t 151, to transmitter 105 that provides the clock inputs of flip flops within transmitter 105 to synchronize the parallel output data. In this example, we assume the rate of serializer 144 is 8 to 1. Thus, the frequency of clk8t 151 is eight times slower than the frequency of clkrin 150. Similarly, the frequency of clk8r 152 is eight times slower than the frequency of clkrin 150, clk4r 153 is four times slower than the frequency of clkr 150, and clk2r 154 is two time slower than the frequency of clkr 150.

The critical issue in this architecture is the alignment of the clock phase relative to data in the data capture block in the receiver. Many factors can cause the incoming data to be misaligned with respect to clk8r 152, such as buffer delays in transmitter 105 and PCB propagation delays. This misalignment in turn can result in a high bit error rate due.

Figure 2:
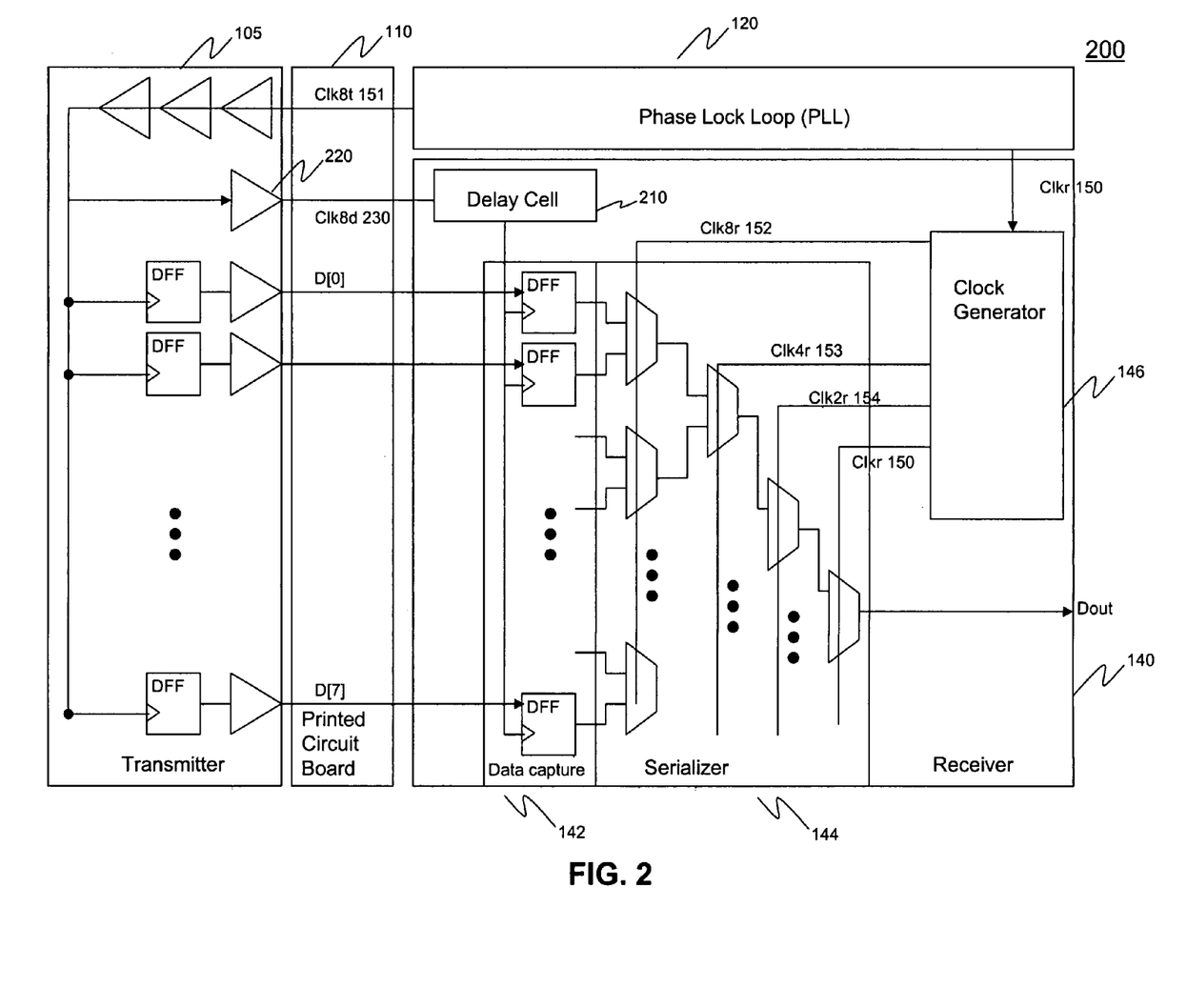
FIG. 2 is a diagram of a data acquisition system with a delay cell.

The conventional way to solve this problem is to add a delay cell 210 in receiver 140. FIG. 2 provides a diagram of high speed data acquisition system 200 that illustrates this approach. In this architecture, transmitter 105 receives clk8t 151 and sends back the clock signal, clk8d 230, with similar buffers, such as buffer 220, in the data path so that the delay in the clk8d 230 signal and data signals, D[0] through D[7] are matched. In receiver 140 clk8d 230 is further adjusted by delay cell 210, so that timing can be optimized.

While the architecture depicted in FIG. 2 can fix timing issues in data capture module 142, the architecture creates additional timing problems between the data capture module 142 and serializer 144. A possible solution to address this problem would be to add a series of first-in, first-out (FIFO) buffers between data capture module 142 and serializer 144. Unfortunately, this adds additional power requirements, increase the area needed to implement the architecture and adds significant complexity.

Another problem with the architecture depicted in FIG. 2 relates to synchronicity. In some applications, a system requires synchronicity for multiple transmitters and receivers based on a single clock system. In the architecture depicted in FIG. 2, the system is synchronous with clk8r 152 and not with clk8t 151, which is unacceptable in some applications.

Figure 3:
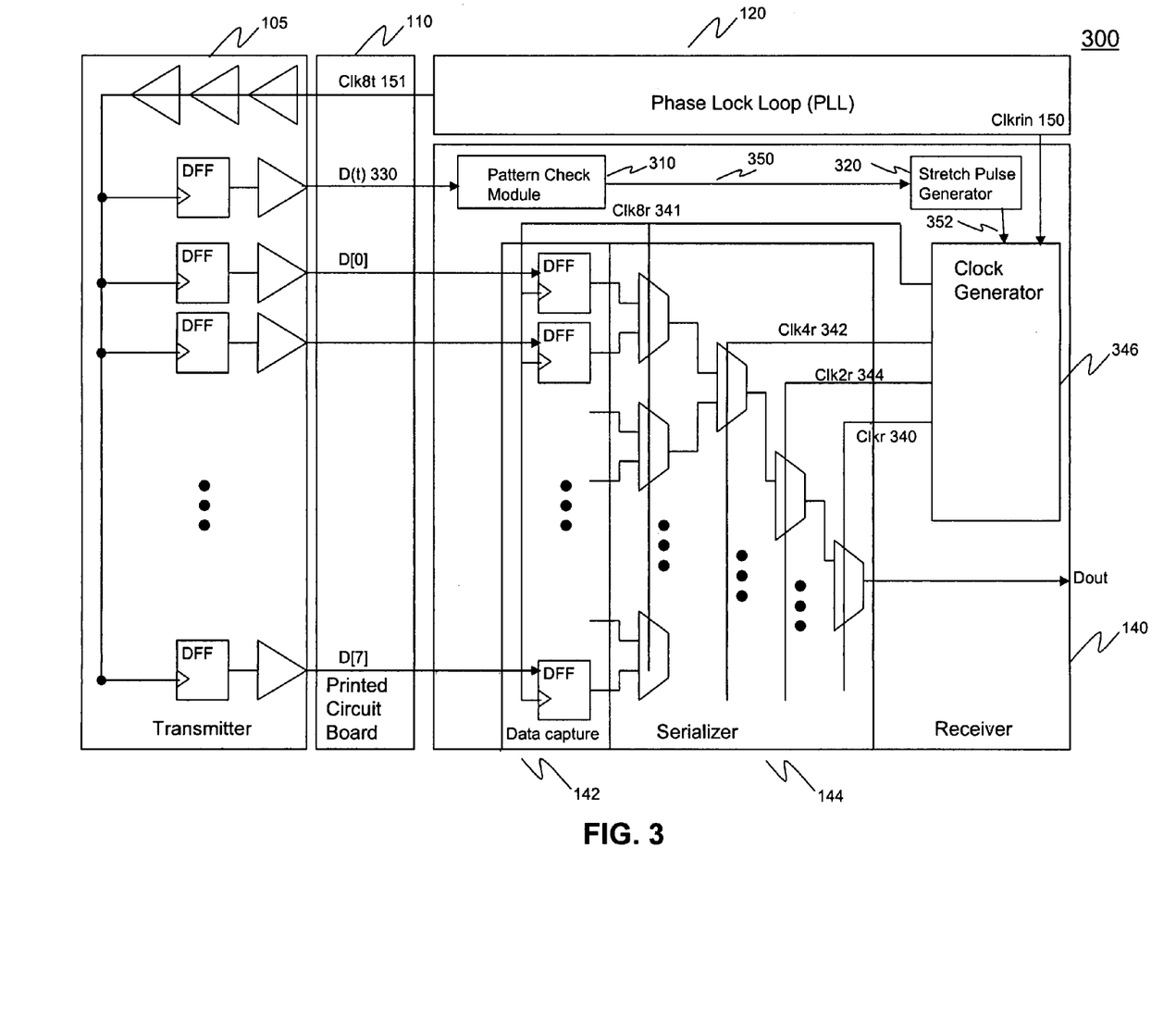
FIG. 3 is a diagram of a high speed data acquisition system that includes a pulse stretching architecture for phase alignment of multi-frequency clocks.

FIG. 3 provides a diagram of high speed data acquisition system 300 that includes a pulse stretching architecture for phase alignment of multi-frequency clocks, according to an embodiment of the invention. The pulse stretching architecture depicted in FIG. 3 includes a pattern check module 310 and a signal generator 320 that are used to address the timing issues discussed above.

As in the cases of high speed data acquisition system 100 and 200, high speed data acquisition system 300 includes a transmitter 105 and a receiver 140. Transmitter 105 transmits parallel digital data to receiver 140. Receiver 140 processes the received data and outputs the received parallel data as a serial data stream.

Receiver 140 includes data capture module 142, serializer 144 and clock generator 346. Data capture module 142 provides for the initial capture of parallel data received from transmitter 105. Serializer 144 multiplexes the digital parallel input data received from transmitter 105 to a single high speed data path. Clock generator 346 generates a variety of output clocks that are used to synchronize data capture module 142 and serializer 144.

High speed clock signals, clkrin 150 and clk8t 151 are generated by Phase lock loop (PLL) circuit 120. PLL circuit 120 transmits clkrin 150 to clock generator 346. Based on clkrin 150, clock generator 146 generates the necessary lower-speed clocks for use in serializer 144. In particular, clock generator 346 generates clk8r 341, clk4r 342, and clk2r 344. The clkr8r 341 signal is provided to the clock inputs of flip-flops in data capture module 142. The clk8r 341, clk4r 342, clk2r 344 and clkr 340 signals are provided to gates within the various stages in serializer 144.

PLL circuit 120 provides a clock signal, clk8t 151, to transmitter 105 that provides the clock inputs of flip flops within transmitter 105 to synchronize the parallel output data.

In addition to sending data signals, transmitters, such as transmitter 105, typically send out known data or test patterns, such as D(t) 330. These signals such as, for example, a parity pattern are recognized by a receiver. High speed data acquisition system 300 uses this data to help determine whether clock phase alignment is necessary.

In particular, pattern check module 310 receives the D(t) 330 and calculates a performance measure, such as, for example a bit error rate (BER). Based on its evaluation of D(t) 330 and the associated BER, pattern check module 310 sends stretch command signal 350 to stretch pulse generator 320.

The function of pulse stretch generator 320 is to generate a stretch pulse signal 352 and provide that signal to clock generator 346. When stretch pulse signal 352 is enabled, clock generator 346 will absorb one clock cycle of clkr 340 and stretch out the periods of clk2r 344, clk4r 342, and clk8r 341. Thus, equivalently the phase of clk8r 341 relative to the incoming data is delayed by a clock period of clkr 340, whenever stretch pulse signal 352 is enabled. That is, when stretch command signal 350 is enabled, the timing (or the phase) of the lower speed clocks will be adjusted by one period of high speed clock, clkrin 150.

Figure 6:
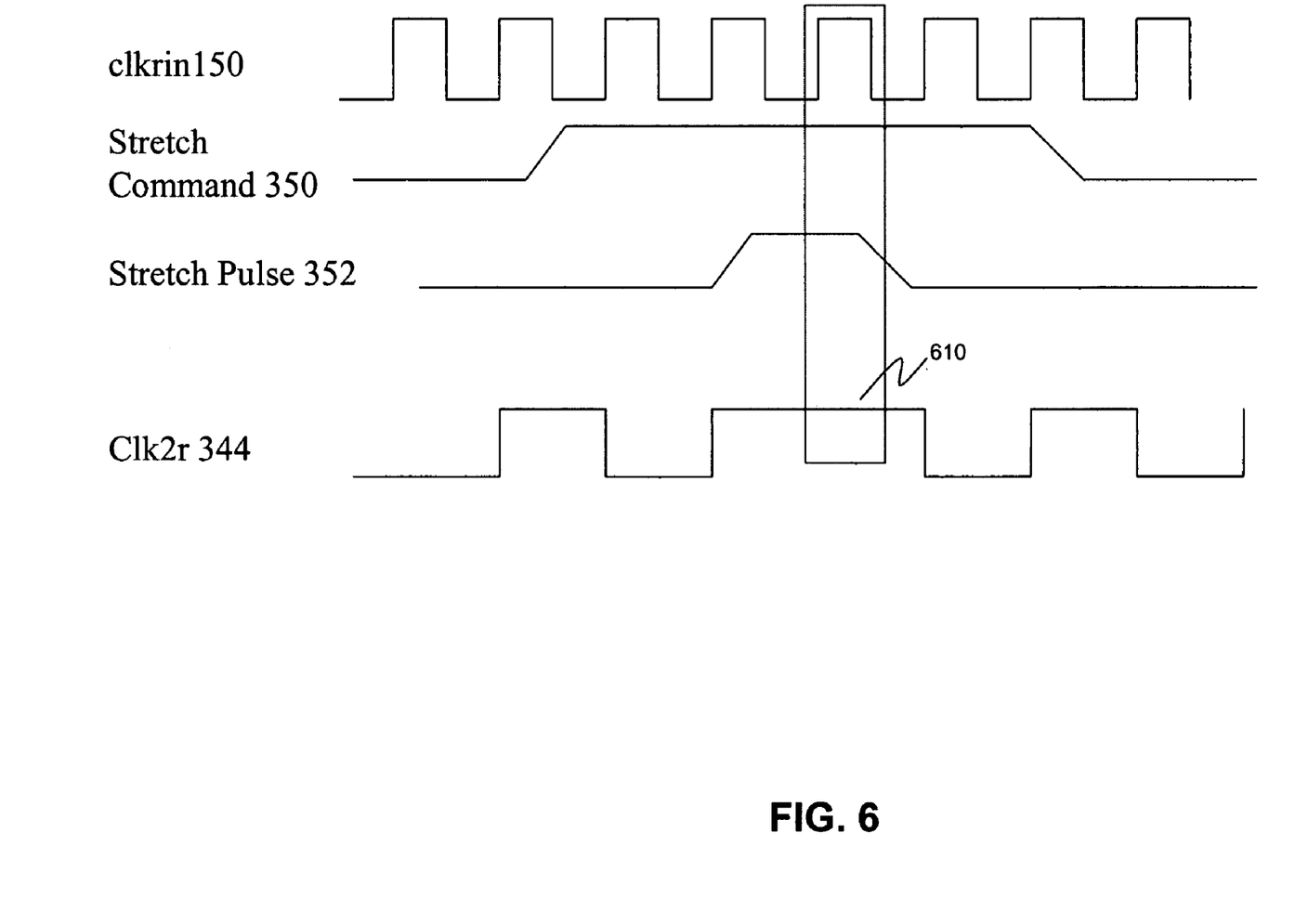
FIG. 6 is a diagram that shows the timing relationships between a stretch command signal and a stretch pulse signal to illustrate the phase shift impact on a clock signal.
Figure 7:
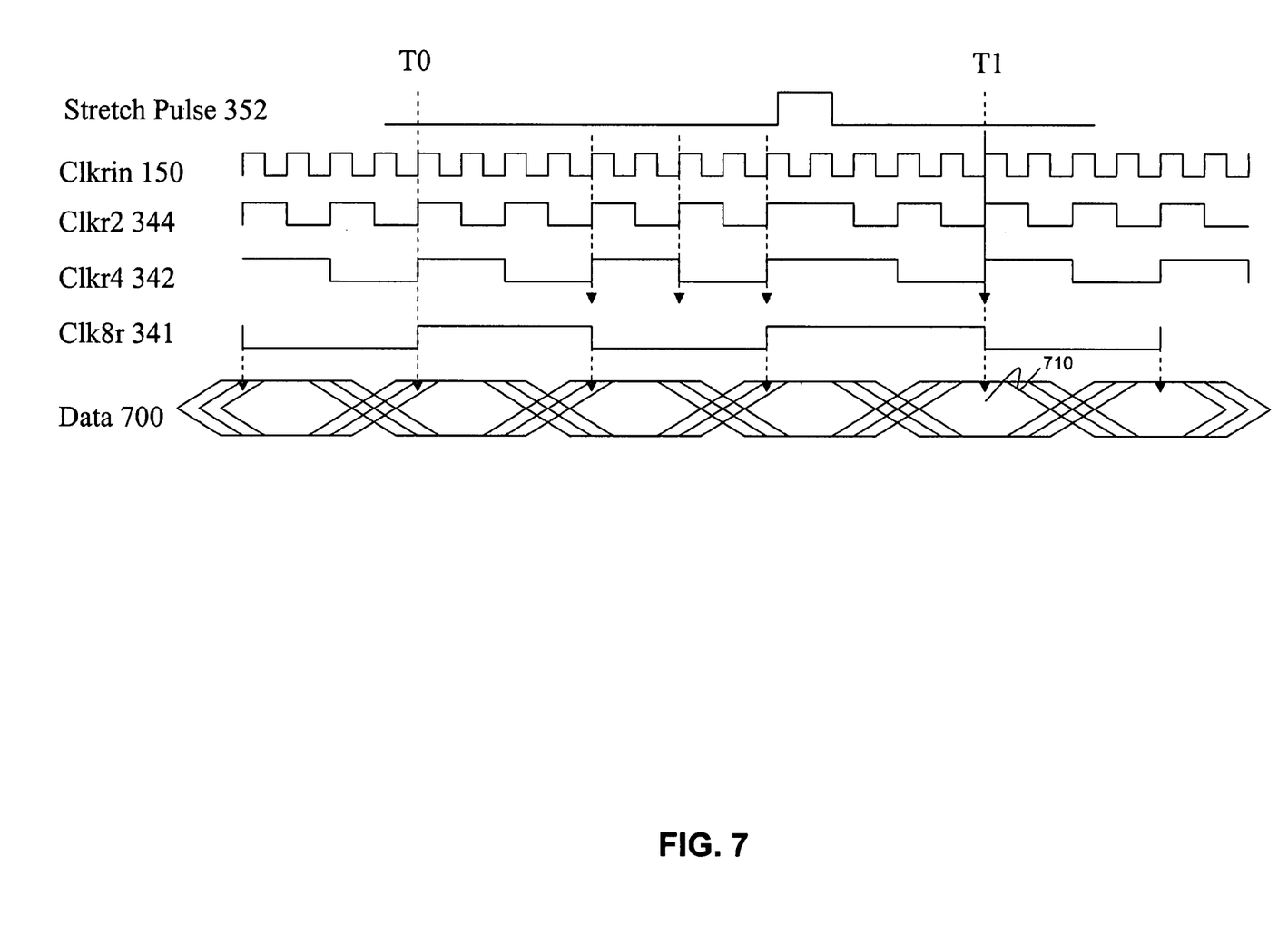
FIG. 7 is a diagram that shows the timing relationship of various control signals and clock signals.

FIGS. 6 and 7 illustrate the relationship of stretch command signal 350 and stretch pulse signal 352 with respect to the various clock outputs and the adjustments to their phase.

The acquisition process will continue and the system will record the BER or other performance measure as a function of the number of delayed pulses. Then the system will set the phase of the lower-speed clocks, such that the system has the lowest BER. Using this approach, when the process stabilizes, the edge of clk8r 341 will be in the middle of the pulses for the data signals D[0]-D[7].

Although the above systems focus on an 8-bit data acquisition system, the present invention can be applied to any type of n-bit data acquisition system. In other embodiments, the present invention can be applied to any type of digital circuitry in which the phase of different speed clock signals must be aligned. Additionally, for multi-chip synchronization, the architecture illustrated in FIG. 3 can be applied, as will be understand by individuals skilled in the relevant arts based on the teachings herein.

Figure 4:
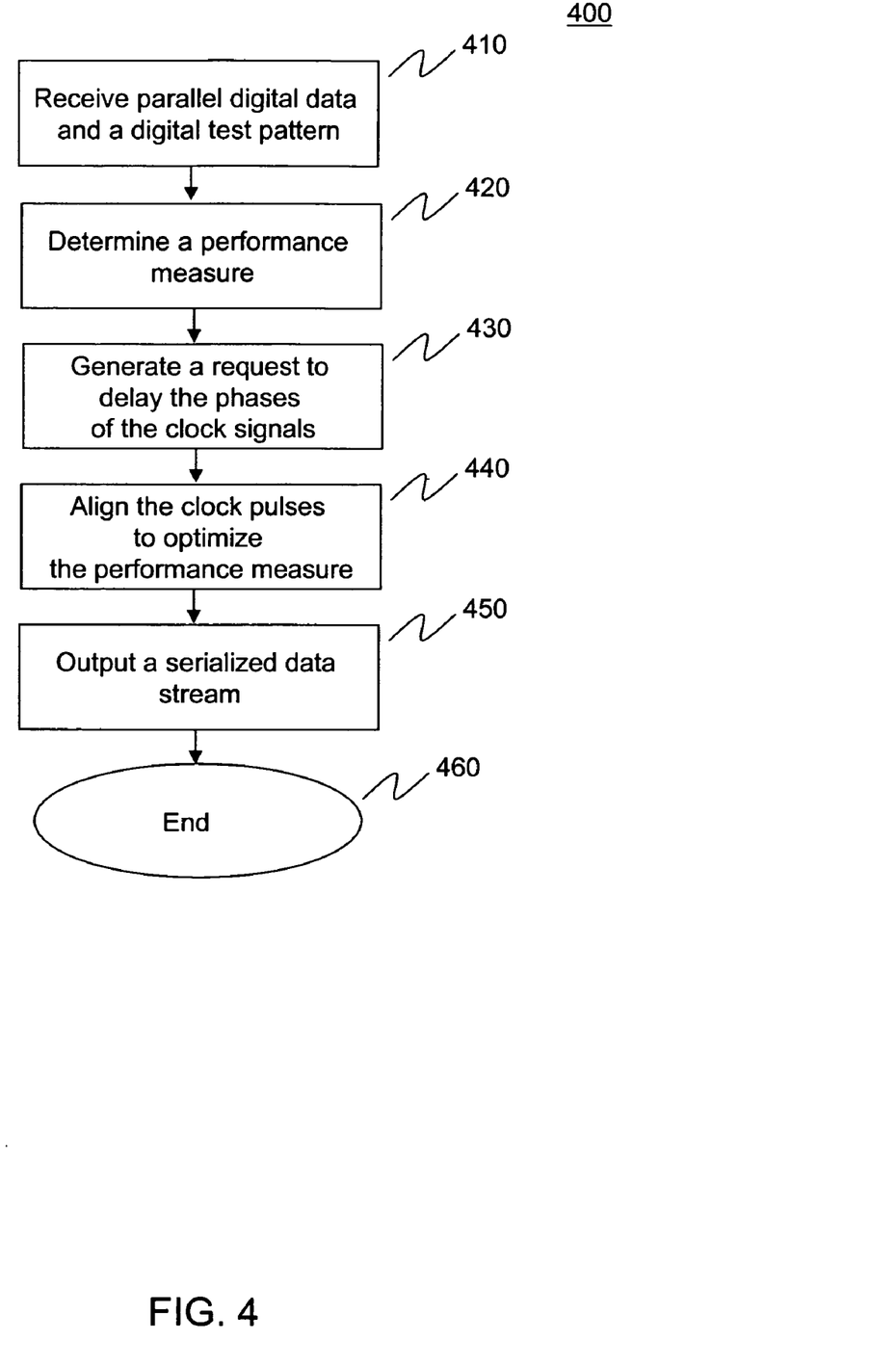
FIG. 4 is a flowchart of a method for serializing high speed data within a high speed data acquisition system.

FIG. 4 is a flowchart of method 400 for serializing high speed data within a high speed data acquisition system, such as, for example, high speed data acquisition system 300. Method 400 begins in step 410. In step 410, a digital test pattern and/or parallel digital data are received. For example pattern check module 310 can receive test pattern D(t) 330 from transmitter 105 and/or data capture module 142 can receive parallel digital data from transmitter 105.

In step 420 a performance measure is determined. For example, pattern check module 310 can determine a bit error rate for the received D(t) 330 test pattern.

In step 430 a request to delay the phases of the plurality of clock signals is generated. In one embodiment a preset threshold for a performance measure is established. For example the performance measure may be a bit error rate for the test pattern. When, for example, pattern check module 310 determines that the preset threshold has been exceeded (ie., performance has degraded below an acceptable level) pattern check module 310 sends a request to stretch pulse generator 320 to delay the phases of the plurality of clock signals that are generated by clock generator 346.

In step 440, the clock pulses are aligned to improve or optimize the performance measure. For example, the clock pulses can be delayed by the period of the fastest clock to effectively shift the phases of each clock, such as, for example, clkr2 344, clkr4 342 and clkr8 341. Commonly owned, copending U.S. patent application Ser. No. 11/256,169, entitled Multi-Frequency Clock Stretching Circuits, which is hereby incorporated by reference herein, describes circuits that can be used to align the clock signals.

When generating the multi-frequency clock signals, such at clkr 340, clk2r 344, clk4r 343, and clk8r 341, in general, low speed clocks are divided down from high-speed clocks. For example, a 2T clock (e.g., clk2r 344) is obtained from a 1T clock (e.g., clkr 340) by dividing by 2, where T is the clock period. A 4T clock (e.g., clk4r 343) is obtained from the 2T clock by dividing by 2. An 8T clock (e.g., clk8r 341) is obtained from the 2T clock by dividing by 4 and so on. Alternatively, each clock can be obtained by dividing by 2. The objective is to adjust the 2T, 4T and 8T clocks simultaneously by the same fixed amount of time through a digital control signal, such as stretch pulse signal 352, as illustrated in FIGS. 6 and 7. Whenever, stretch pulse signal 352 goes high, all clocks will be delayed by the same amount of time.

A stretch command signal 350 is converted to a stretch pulse signal 352 by stretch pulse generator 320. Then a clock signal with 2T period is stretched by the shortest clock period, for example 1T, without introducing any extra transitions. Since a 4T, 8T, etc clocks are obtained from the 2T clock, these clocks will automatically be stretched by exactly 1T. The timing relationships are therefore maintained before and after the clock stretching.

In step 450, a serialized data stream is output. For example, receiver 140 outputs Dout. In step 460, method 400 ends.

Figure 5:
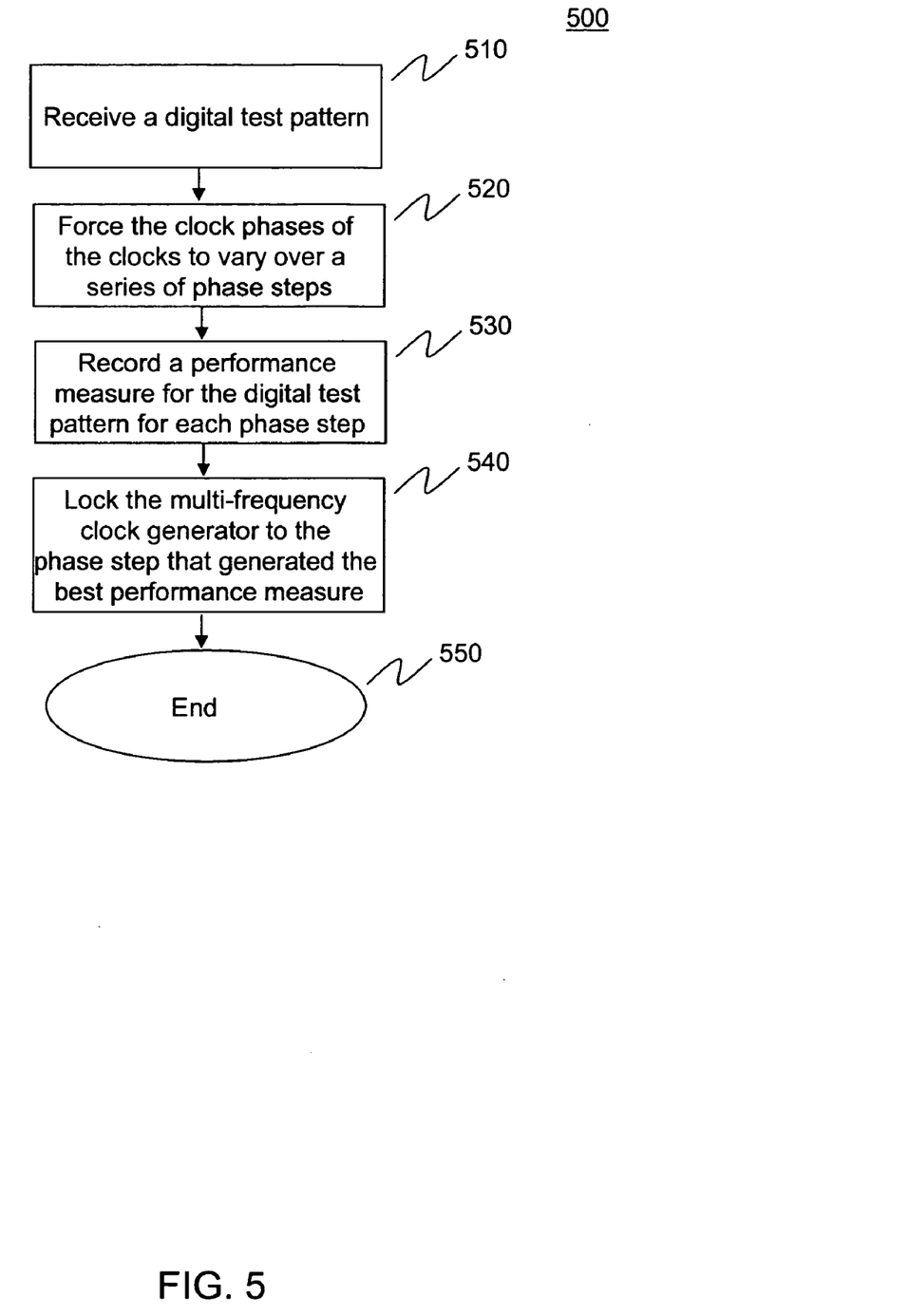
FIG. 5 provides a flowchart of a method for initializing a high speed data acquisition system.

FIG. 5 provides a flowchart of method 500 for initializing a high speed data acquisition system. Method 500 begins in step 510. In step 510, a digital test pattern is received. For example, pattern check module 310 can receive digital test pattern d(t) 330 from transmitter 105.

In step 520, clock phases of a multi-frequency clock generator are forced to vary over a series of phase steps. In one example, the phase steps are equal to the period of the fastest clock within the clocks generated by a multi-frequency clock generator.

In step 530, a performance measure for the digital test pattern for each phase step is determined and recorded. Thus, for example, each time a phase step occurs, pattern check module 310 determines and records a bit error rate for the digital test pattern D(t) 330.

In step 540 the multi-frequency clock generator is locked to the phase step that generated the best performance measure. For example, if the bit error rate was the lowest for a digital test pattern after the phase of all the clocks had been shifted by two steps, pattern check module 310 sends sufficient stretch command signals to shift and lock clock generator 352 by two steps for each clock being generated. Recall that a phase step is equal to the period of the fastest clock. Method 500 ends in step 550.

FIG. 6 is a diagram that shows the timing relationships between stretch command signal 350 and stretch pulse signal 352 to illustrate the phase shift impact on a clock signal, such as clk2r 344. The diagram illustrates that when stretch command signal 350 is enabled, a stretch pulse generator will enable stretch pulse signal 352. This in turn will lead to delaying the phase of clk2r 344 by one period of clkrin 150, as illustrated by the highlighted area 610 in the diagram.

FIG. 7 is a diagram that shows the timing relationship of various control signals and clock signals. FIG. 7 includes clkrin 150, which is the fastest clock. The clock can be a 2.3 Ghz received clock signal, but is not limited to this frequency. FIG. 7 also includes stretch pulse signal 352, which is generated by stretch pulse generator 320.

Clk2r 344 is a 2T clock signal (1.15 Ghz), where T is the period of clkrin 150. Clk4r 342 is a 4T clock signal (573 Mhz). Clk8r 341 is an 8T clock signal (288 Mhz). FIG. 7 shows that clock signals 341, 342 and 341 are each delayed by 1T when stretch pulse signal 352 is enabled. The diagram illustrates the effect of shifting the phase of the clock signals.

The diagram includes data 700. Data 700 has some uncertain states on their state transitions due to the noise coupling from a link or jitter of a clock on the transmitter side of a high speed data acquisition system. Intuitively, the best sampling points for the data sampled is in the middle of the "eye" shown as point 710 in FIG. 7. In this example, at time T0, the clock phase of clk8r 341, which is the clock used to capture the input data in the capture stage, is not at the optimum position because it is close to the left crossing point of data 700. After enabling pulse stretch signal 352, the clk8r 341 is delayed by a period of clkrin 150. Thus, at time T1, clk8r 341 is closer to the optimum position to sample the data.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A high speed data acquisition system, comprising:
    a transmitter that transmits parallel digital data; and
    a receiver that receives parallel digital data and outputs the parallel digital data as a serial digital data signal;
        wherein the receiver includes:
            a multi-frequency clock generator that generates a plurality of clock signals;

a pattern check module that detects a test pattern received from the transmitter and outputs a stretch command signal; and a stretch pulse generator that receives the stretch command signal and provides a stretch pulse signal that aligns the phases of the plurality of clock signals generated by the multi-frequency clock generator.

2. The high speed data acquisition system of claim 1, wherein said high speed data acquisition is an n-bit data acquisition system, wherein n equals any integer greater than 2.

3. The high speed data acquisition system of claim 1, wherein the receiver further comprises:

a data capture module that captures digital parallel data received from the transmitter; and a serializer that multiplexes the digital parallel data captured by the data capture module.

4. The high speed data acquisition system of claim 1, wherein the pattern check module includes an initialization sequence that forces the phase of clocks to vary over the period of the slowest clock within the multi-frequency clock generator with a step substantially equal to the period of the fastest clock within the multi-frequency clock generator to determine which position has the lowest bit error rate.

5. The high speed data acquisition system of claim 1, wherein the pattern check module monitors a performance threshold and generates a stretch command signal when the performance threshold is not met, wherein the stretch command signal forces the multi-frequency clock generator to shift the phases of the plurality of clock signals that are generated.

6. The A high speed data receiver, comprising:

a multi-frequency clock generator that generates a plurality of clock signals;

a pattern check module that detects a test pattern received from a transmitter and outputs a stretch command signal; and a stretch pulse generator that receives the stretch command signal and provides a stretch pulse signal that shifts the phases of the plurality of clock signals generated by the multi-frequency clock generator.

7. The high speed data receiver of claim 6, further comprising:

a data capture module that captures digital parallel data received from the transmitter; and a serializer that multiplexes the digital parallel data captured by the data capture module.

8. The high speed data receiver of claim 6, wherein the pattern check module includes an initialization sequence that forces the phase of clocks to vary over the period of the slowest clock within the multi-frequency clock generator with a step substantially equal to the period of the fastest clock within the multi-frequency clock generator to determine which position has the lowest bit error rate.

9. The high speed data receiver of claim 6, wherein the pattern check module monitors a performance threshold and generates a stretch command signal when the performance threshold is not met, wherein the stretch command signal forces the multi-frequency clock generator to shift the phases of the plurality of clock signals that are generated.

10. A method for serializing high speed digital data within a high speed data acquisition system having a multi-frequency clock generator that generates a plurality of clock signals; comprising (a) receiving a parallel digital data input and a digital test pattern;

(b) determining a performance measure associated with either the digital test pattern or received parallel digital data;

(c) generating a request to delay the phases of the plurality of clock signals based on the determined performance measure;

(d) aligning the clock pulses to optimize the performance measure of either the digital test pattern or received parallel digital data;

(e) outputting a serialized data stream based on the received parallel digital data input, wherein the aligned clock pulses are used to serialize the received parallel digital data input.

11. The method of claim 10, wherein the performance measure is a bit error rate.

12. The method of claim 10, wherein step (c) further comprises (i) determining that a performance measure has reached a preset threshold; and (ii) generating a request to delay the phases of the plurality of clock signals based on the determined performance measure.

13. The method of claim 10, wherein step (d) comprises delaying the phases of the plurality of clock signals for a period substantially equal to the shortest period of the periods of the clock signals.

14. The method of claim 10, wherein the multi-frequency clock generator generates four different frequency clocks, wherein step (d) comprises dividing a first clock signal with the shortest period by two to generate a second clock signal and the first clock signal is divided by four to generate a third clock signal and the first clock signal is divided by eight to generate a fourth clock signal.

15. The method of claim 10, wherein the high speed data acquisition system in included within a cable modem termination system (CMTS).

16. A method for initializing a high speed data acquisition system having a multi-frequency clock generator that generates a plurality of clock signals; comprising (a) receiving a digital test pattern;

(b) forcing the phases of the clocks among the plurality of clock signals to vary over the period of the slowest clock with a phase step equal to the period of the fastest clock among the plurality of clock signals;

(c) recording a performance measure associated with the digital test pattern for each phase step; and (d) locking the multi-frequency clock generator to the phase step based on a comparison of the performance measures generated in step (c).

17. The method of claim 16, wherein the performance measure is bit error rate.

* * * * *

UNITED STATES PATENT AND TRADEMARK OFFICE
CERTIFICATE OF CORRECTION

PATENT NO.         : 7,209,848 B2                                            Page 1 of 1
APPLICATION NO. : 11/256156
DATED              : April 27, 2007
INVENTOR(S)        : Jiang et al.

It is certified that error appears in the above-identified patent and that said Letters Patent is hereby corrected as shown below:

- At column 7, line 32, "The A high speed" should be replaced with --A high speed--.
- At column 8, line 41, "system in included" should be replaced with --system is included--.

Signed and Sealed this

Third Day of July, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,209,848 B2 | Page 1 of 1 |
| APPLICATION NO. | : 11/256156 | |
| DATED | : April 24, 2007 | |
| INVENTOR(S) | : Jiang et al. | |

It is certified that error appears in the above-identified patent and that said Letters Patent is hereby corrected as shown below:

- At column 7, line 32, "The A high speed" should be replaced with --A high speed--.
- At column 8, line 41, "system in included" should be replaced with --system is included--.

This certificate supersedes Certificate of Correction issued July 3, 2007.

Signed and Sealed this

Thirty-first Day of July, 2007

JON W. DUDAS
*Director of the United States Patent and Trademark Office*